United States Patent
Wang

(10) Patent No.: US 9,900,201 B2
(45) Date of Patent: Feb. 20, 2018

(54) TIME DE-INTERLEAVING CIRCUIT AND METHOD THEREOF

(71) Applicant: MStar Semiconductor, Inc., Hsinchu Hsien (TW)

(72) Inventor: Chun-Chieh Wang, Hsinchu County (TW)

(73) Assignee: MSTAR SEMICONDUCTOR, INC., Hsinchu Hsien (TW)

( * ) Notice: Subject to any disclaimer, the term of this patent is extended or adjusted under 35 U.S.C. 154(b) by 0 days.

(21) Appl. No.: 15/459,142

(22) Filed: Mar. 15, 2017

(65) Prior Publication Data

US 2017/0359208 A1    Dec. 14, 2017

(30) Foreign Application Priority Data

Jun. 13, 2016  (TW) .............................. 105118299 A

(51) Int. Cl.
*H04L 27/26*   (2006.01)
*H04L 29/06*   (2006.01)

(52) U.S. Cl.
CPC .......... *H04L 27/2649* (2013.01); *H04L 69/22* (2013.01)

(58) Field of Classification Search
CPC ............................ H04L 27/2649; H04L 69/22
See application file for complete search history.

(56) References Cited

U.S. PATENT DOCUMENTS

| 5,473,634 A * | 12/1995 | Harada | .............. G11B 20/1426 375/242 |
| 2007/0043982 A1* | 2/2007 | Arivoli | ............. H03M 13/2707 714/701 |
| 2010/0197302 A1* | 8/2010 | Chen | ..................... H04W 99/00 455/434 |
| 2013/0329811 A1* | 12/2013 | Breiling | ................. H04H 20/72 375/240.26 |

* cited by examiner

*Primary Examiner* — Dac Ha
(74) *Attorney, Agent, or Firm* — WPAT, PC

(57) ABSTRACT

A time de-interleaving circuit and a time de-interleaving method perform a time de-interleaving process through writing and reading a plurality of sets of time interleaved data into and from a first memory and a second memory. The time de-interleaving method includes: selecting a set of first time interleaved data and a set of second time interleaved data from the plurality of sets of time interleaved data, the set of first time interleaved data and the set of second time interleaved data having the same delay length; writing the set of first time interleaved data into the first memory; and writing the set of second time interleaved data into the second memory. The first memory utilizes a bit length as an access unit, and the second memory has an access unit smaller than the bit width.

20 Claims, 4 Drawing Sheets

TIME DE-INTERLEAVING CIRCUIT AND METHOD THEREOF

This application claims the benefit of Taiwan application Serial No. 105118299, filed Jun. 13, 2016, the subject matter of which is incorporated herein by reference.

BACKGROUND OF THE INVENTION

Field of the Invention

The invention relates in general to a time de-interleaving circuit and method, and more particularly to a convolutional time de-interleaving circuit and method.

Description of the Related Art

A receiver of Integrated Services Digital Broadcasting (ISDB) signals adopts convolutional time de-interleaving. In general, time interleaved data (e.g., data generated by a front-end frequency de-interleaving process) is divided into 13 groups, each of which further divided into n sections (n being different values for different transmission modes, as shown in Table-1). A plurality of sets of data of the same section undergo the same delay. The 13 groups of time-interleaved data may be divided into three layers, each of which using an independent time interleaving length l. FIG. 1 shows a schematic diagram of a receiver performing a time de-interleaving process. As shown in FIG. 1, the 13 groups of time interleaved data respectively correspond to 13 convolutional de-interleaving circuits 110, each of the 13 convolutional de-interleaving circuits 110 processes one group of data, and n paths respectively correspond to the n sections of data. Based on specifications, the delay length $d_i$ of a path i may be represented as (taking a transmission mode 1 for example, where i=0~95):

$$d_i = I \times (95 - ((i \times 5) \bmod 96)) \quad (1)$$

In equation (1), l is the time interleaving length, and each transmission mode provides a plurality of time interleaving lengths l (as shown in Table-1). In practice, the time de-interleaving process of the convolutional de-interleaving circuits 110 may be achieved through writing/reading a memory. The memory size corresponding to each path is directly proportional to the delay length of the path. Assume that the data size (i.e., the code-word length) of each set of data $DX_{p, q}$ (where X is the number of the convolutional de-interleaving circuit 110, p is a path number in one convolutional de-interleaving circuit 110, and q represents the order of the set of data in the section) is 21 bits (e.g., in orthogonal frequency-division multiplexing (OFDM), the in-phase component occupies 7 bits, the quadrature component occupies 7 bits and the channel state information (CSI) occupies 7 bits). When a memory is implemented by a dynamic random access memory (DRAM) having a bit width of 128 bits or by a synchronous dynamic random access memory (SDRAM), and each set of data $DX_{p, q}$ is written, a waste of 107 bits (=128−21) of the memory is caused, which may result in a severe issue in an integrated system where memory resources are valuable.

TABLE 1

(Different transmission modes having different parameters, e.g., modulation schemes and code rates)

| Transmission mode | n | Time interleaving length I |
|---|---|---|
| 1 | 96 | 0, 4, 8, 16 |
| 2 | 192 | 0, 2, 4, 8 |
| 3 | 384 | 0, 1, 2, 4 |

SUMMARY OF THE INVENTION

It is an object of the present invention to provide a time de-interleaving circuit and method to more effectively utilize a memory.

The present invention discloses a time de-interleaving method that performs a time de-interleaving process through writing and reading a plurality of sets of interleaved data into and from a storage circuit. The time de-interleaving method includes: selecting K sets of de-interleaving data from a plurality of sets of de-interleaved data, the K sets of de-interleaved data having a same delay length, K being an integer greater than 1; generating data to be written, the data to be written including the K sets of time de-interleaved data; and in a same writing operation, writing the data to be written into the storage circuit. A bit width of the storage circuit is greater than or equal to a data size of the data to be written.

The present invention further discloses a time de-interleaving circuit. The time de-interleaving circuit includes: a buffer circuit, buffering a plurality of sets of time interleaved data; a storage circuit; and a control circuit, coupled to the buffer circuit and the storage circuit, selecting K sets of time de-interleaved data from the buffer circuit to form data to be written, and writing the data to be written into the storage circuit in a same writing operation. The K sets of data have a same delay length, K is an integer greater than 1, and a bit width of the storage circuit is greater than or equal to a data size of the data to be written.

The present invention further discloses a time de-interleaving method that performs a time de-interleaving process through writing and reading a plurality of sets of interleaved data into and from a first memory and a second memory. The method includes: selecting a set of first time interleaved data and a set of second time interleaved data from the sets of time interleaved data, the set of first time interleaved data and the set of second time interleaved data having a same delay length; writing the set of first time interleaved data into the first memory; and writing the set of second time interleaved data into the second memory. The first memory utilizes a bit width as an access unit, and the second memory has an access unit smaller than the bit width.

The present invention further discloses a time de-interleaving circuit. The time de-interleaving circuit includes: a buffer circuit, buffering a plurality sets of time interleaved data; a first memory, utilizing a bit width as an access unit; a second memory, having an access unit smaller than the bit width; and a control circuit, coupled to the buffer circuit, the first memory and the second memory, selecting a set of first time interleaved data and a set of second time interleaved data from the buffer circuit, and writing the set of first time interleaved data into the first memory and the set of second time interleaved data into the second memory. The set of first time interleaved data and the set of second time interleaved data have a same delay length.

In the time de-interleaving circuit and method of the present invention, time interleaved data having the same delay length forms data to be written, which is written into a memory in a same writing operation. Therefore, the memory may be more efficiently utilized to reduce the waste in memory space. Further, two memories are applied in the present invention to store time interleaved data, and the access unit of one of the memories is a fixed data size while the access unit of the other is not limited.

The above and other aspects of the invention will become better understood with regard to the following detailed description of the preferred but non-limiting embodiments. The following description is made with reference to the accompanying drawings.

DETAILED DESCRIPTION OF THE INVENTION

The disclosure of the present invention includes a time de-interleaving circuit and method. In possible implementation, one person skilled in the art my select equivalent elements or steps to achieve the present invention based on the disclosure of the application; that is, the implementation of the present invention is not limited to the embodiments below.

Figure 2:
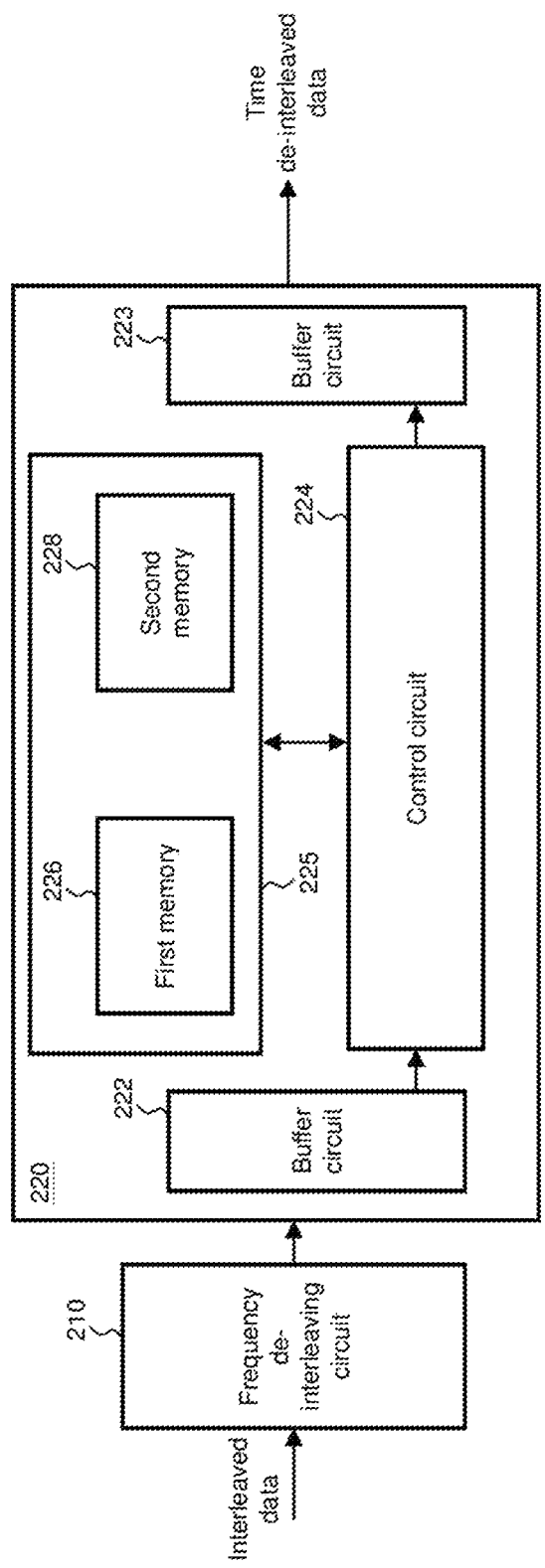
FIG. 2 is a block diagram of a time de-interleaving circuit according to an embodiment of the present invention.
Figure 3:
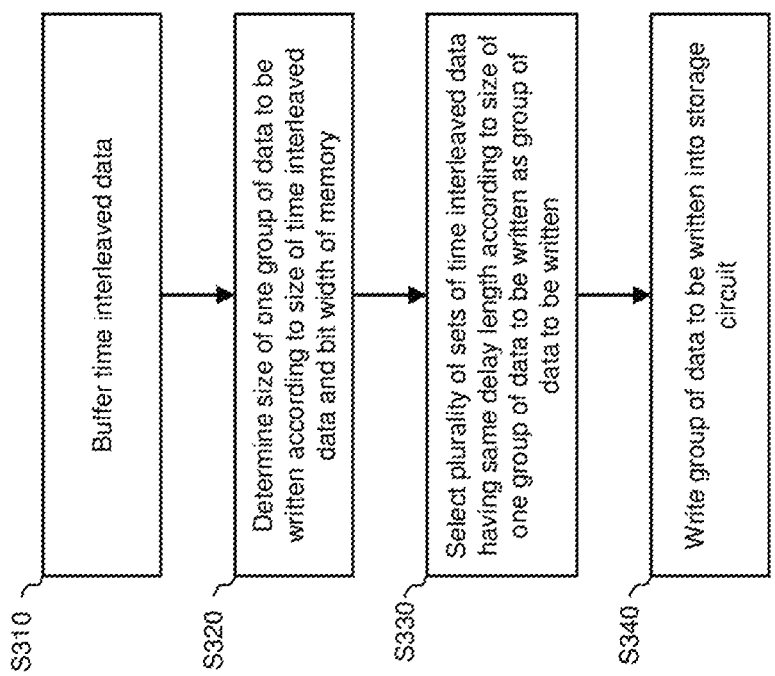
FIG. 3 and FIG. 4 are flowcharts of a time de-interleaving method according to an embodiment of the present invention.
Figure 4:
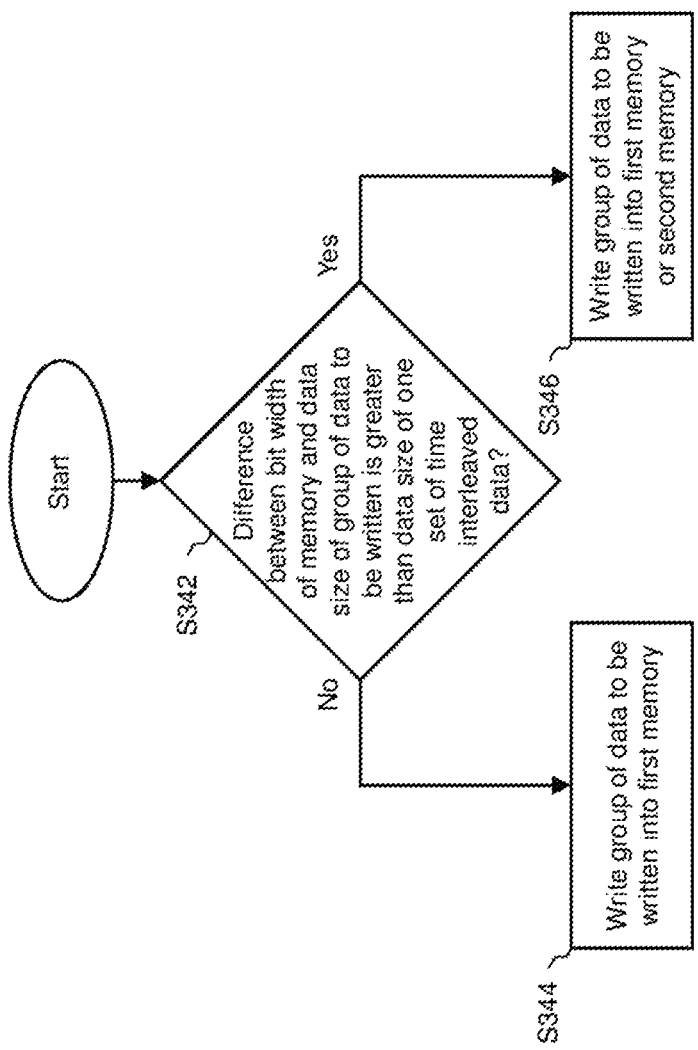

FIG. 2 shows a block diagram of a time de-interleaving circuit according to an embodiment of the present invention. FIG. 3 and FIG. 4 show flowcharts of a time de-interleaving method according to an embodiment of the present invention. A time de-interleaving circuit 220 receives time interleaved data (i.e., the foregoing data $DX_{p,q}$) from a frequency de-interleaving circuit 210, and buffers the time interleaved data in a buffer circuit 222 (step S310). A control circuit 224 then writes and reads data into and from a storage circuit 225 to complete time de-interleaving. The data read from the storage circuit 225 is buffered in the buffer circuit 223, and is outputted according to a normal time de-interleaving sequence. The storage circuit 225 includes a first memory 226 and a second memory 228. The first memory 226 (e.g., DRAM or SDRAM) is accessed in a unit of one bit width each time; the second memory 228 may be a DRAM or SDRAM having a bit width smaller than the bit width of the first memory 226, or a memory that does not have a minimum access unit (e.g., a static random access memory (SRAM)).

Figure 1:
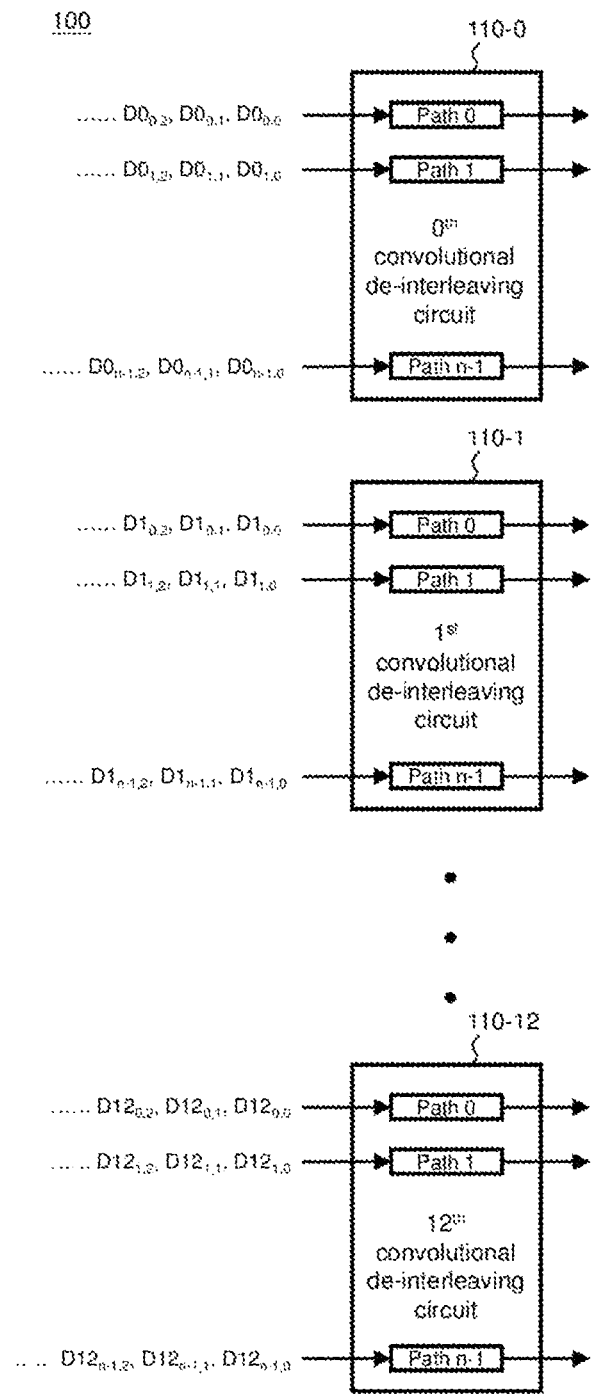
FIG. 1 is a schematic diagram of a time de-interleaving process.

Referring to FIG. 1, several of the 13 convolutional de-interleaving circuits 110 have the same time interleaving length l. For example, assuming that the $0^{th}$ convolutional de-interleaving circuit 110-1 and the $1^{st}$ convolutional de-interleaving circuit 110-1 have the same time interleaving length l, according to equation (1), data $D0_{0,q}$ and data $D1_{0,q}$ undergo the same delay length, and data $D0_{1,q}$ and data $D1_{1,q}$ undergo the same delay length, and so forth. Further, data having the same q value is generated simultaneously. That is, all of the data $D0_{p,0}$, data $D1_{p,0}$, . . . and data $D12_{p,0}$ corresponding to the parameter p in values 0 to (n-1) is simultaneously generated, all of data $D0_{p,1}$, data $D1_{p,1}$, . . . and data $D12_{p,1}$ corresponding to the parameter p in values 1 to (n-1) is simultaneously generated, and so forth.

Thus, from the buffer circuit 222, the control circuit 224 may simultaneously obtain the data $D0_{0,0}$ and the data $D1_{0,0}$, which both correspond to the same delay length; that is, the data $D0_{0,0}$ and the data $D1_{0,0}$ may be written into the storage circuit 225 at the same time and read from the storage circuit 225 at the same time by the control circuit 224 to complete the time de-interleaving process. Therefore, when writing into the first memory 226, the control circuit 224 may consider these two sets of data as one group of data to be written to save the memory space. More specifically, according to the bit width W of the first memory 226 and the code-word length C of the data $DX_{p,q}$, the control circuit 224 may first calculate that a group of data to be written includes k=[W/C] sets of data $DX_{p,q}$ (step S320). According to the value k, k sets of data $DX_{p,q}$ having the same delay length are selected to form the set of group to be written (step S330), and the group of data to be written is written into the storage circuit 225 (step S340). More specifically, at this point, the group of data to be written is written into the first memory 226. Table-2 below lists the mapping relationship between several W values and k values (taking C=21 bits for instance).

TABLE 2

| Bit width (W) | Number of sets of data included in one group of data to be written |
| --- | --- |
| 64 | 3 |
| 128 | 6 |
| 256 | 12 |

Taking actual numbers for instance (the scenario 1), assume that the transmission mode of the 13 groups of time interleaved data is 1 and the 13 groups of time interleaved data have the same time interleaving length l=16, the bit width of the first memory 226 is W=128 bits, and the code-word length of the data $DX_{p,q}$ is C=21 bits. Thus, the memory size (bits) that a conventional time de-interleaving method needs is:

$$\left\{\sum_{i=0}^{95} 16 \times (95 - ((i \times 5) \bmod 96))\right\} \times 128 \times 13 = 121,405,440$$

In contrast, the time de-interleaving method of the present invention utilizes k=⌉128/21⌈=6 sets of data $DX_{p,q}$ as one group of data to be written, and so the required memory size (bits) is:

$$\left\{\sum_{i=0}^{95} 16 \times (95 - ((i \times 5) \bmod 96))\right\} \times 128 \times \left\lceil \frac{13}{6} \right\rceil = 28,016,640$$

According to the embodiment of the present invention, the memory size needed is only ⅓ of that of the above conventional method.

More specifically, in the foregoing embodiment, $D0_{p,q}$, $D1_{p,q}$, $D2_{p,q}$, $D3_{p,q}$, $D4_{p,q}$ and $D5_{p,q}$ may be used as one group of data to be written $T0_{p,q}$; $D6_{p,q}$, $D7_{p,q}$, $D8_{p,q}$, $D9_{p,q}$, $D10_{p,q}$ and $D11_{p,q}$ may be used as one group of data to be written $T1_{p,q}$; $D12_{p,q}$ may be used as one group of data to be written $T2_{p,q}$. The data $DX_{p,q}$ may be obtained through the buffer circuit 222, and is the $(x*108+p)^{th}$ set of data at the $p^{th}$ time point in the buffer circuit 222. The control circuit 224 may accordingly generate an appropriate control signal to write the data $DX_{p,q}$ into the storage circuit 225. According to the delay length $d_i$ corresponding to each set of the data corresponding $DX_{p,q}$, the control circuit 224 reads the data $DX_{p,q}$ from the storage circuit 225 at corresponding time points. In the foregoing embodiment, the data $DX_{p,q}$ is delayed by $16 \times (95-(p \times 5) \bmod 96)$ time units and then outputted; that is, the set of data to be outputted $T0_{0,q}$ undergoes $16 \times (95-(0 \times 5) \bmod 96)=1520$ time units in the storage circuit 225, and is then outputted. At the time point $q=1520$, $T0_{0,0}$ is outputted, and $T0_{0,1520}$ may be written at a position where $T0_{0,0}$ is originally located in the storage circuit 225. When $T0_{1,80}$ is outputted, $T0_{1,1520}$ is written at a position where $T0_{1,80}$ is originally located in the storage circuit 225. That is, when $T0_{p,1520-16*(95-(p*5)mod96)}$ is outputted, $T0_{p,1520}$ is written at a position where $T0_{p,1520-16*(95-(p*5)mod96)}$ is originally located in the storage circuit 225. The control circuit 224 stores the data $DX_{p,q}$ in the buffer circuit 223 after reading the data $DX_{p,q}$ from the storage circuit 225. It is known from the foregoing reading sequence that, in the buffer circuit 223, the data $DX_{p,q}$ is sequentially $D0_{0,0}$, $D1_{0,0}$, $D2_{0,0}$, $D3_{0,0}$, $D4_{0,0}$, $D5_{0,0}$, $D0_{1,80}$, $D1_{1,80}$, $D2_{1,80}$, $D3_{1,80}$, $D4_{1,80}$, $D5_{1,80}$, ..., $D0_{p,1520-16*(95-(p*5)mod96)}$, $D1_{p,1520-16*(95-(p*5)mod96)}$, $D2_{p,1520-16*(95-(p*5)mod96)}$, $D3_{p,1520-16*(95-(p*5)mod96)}$, $D4_{p,1520-16*(95-(p*5)mod96)}$, $D5_{p,1520-16*(95-(p*5)mod96)}$, ..., $D12_{0,0}$, $D12_{1,80}$, ..., $D12_{p,1520-16*(95-(p*5)mod96)}$, ..., $D12_{94,1376}$ and $D12_{95,1456}$. Next, by adjusting the sequence of outputting the data $DX_{p,q}$ from the buffer circuit 223, the data $DX_{p,q}$ is outputted into the sequence $D0_{0,0}$, $D0_{1,80}$, $D0_{2,160}$, ..., $D0_{p,1520-16*(95-(p*5)mod96)}$, ..., $D0_{94,1376}$, $D0_{95,1456}$, $D1_{0,0}$, $D1_{1,80}$, $D1_{2,160}$, ..., $D1_{p,1520-16*(95-(p*5)mod96)}$, ..., $D1_{94,1376}$, $D1_{95,1456}$, $D2_{0,0}$, $D2_{1,80}$, $D2_{2,160}$, ..., $D2_{p,1520-16*(95-(p*5)mod96)}$, ..., $D11_{94,1376}$, $D11_{95,1456}$, $D12_{0,0}$, $D12_{1,80}$, $D12_{2,160}$, ..., $D12_{p,1520-16*(95-(p*5)mod96)}$, ..., $D12_{94,1376}$ and $D12_{95,1456}$.

The 13 groups of time interleaved data may correspond to multiple time interleaving lengths l (the scenario 2). For example, the l value is 16 for four of the groups, 8 for eight of the groups, and 4 for the remaining one group. When the control circuit 224 determines the group of data to be written (step S330) (k=6 in continuation of the above example), the data $DX_{p,q}$ of the four groups with l=16 may form 1 ($= \lceil 4/6 \rceil$) group of data to be written A, the data $DX_{p,q}$ of the eight groups with l=8 may form 2 ($= \lceil 8/6 \rceil$) groups of data to be written (respectively data to be written B (including six sets of data) and data to be written C (including two sets of data)), and the remaining one group of data $DX_{p,q}$ form 1 ($= \lceil 1/6 \rceil$) group of data to be written D. It is discovered that, two of the four groups of data to be written (the data to be written C and the data to be written D) in fact include only one set and two sets of the time interleaved data $DX_{p,q}$, respectively. Such occurrence results a waste in the first memory 226. Thus, when the control circuit 224 writes the group of data to be written to the storage circuit 225 (step S340), a detailed process in FIG. 4 is further included.

In step S342, the control circuit 224 determines whether a difference between the bit width W of the first memory 226 and the data size of the group of data to be written is greater than the data size of one set of the time-interleaved data $DX_{p,q}$. If so, the group of data to be written is written into the first memory 226 or the second memory 228 according to a determination condition (step S346). If not, the group of data to be written is written into the first memory 226 (step S344). In continuation of the above scenario 2, the data to be written B is written into the first memory 226 (step S344), and the control circuit 224 then determines to write the data to be written C into the first memory 226 or the second memory 228 according to the determination condition. For example, the determination condition may be (1) whether the actual data size of the group of data to be written exceeds one-half of the bit width W; or (2) the group of data to be written includes only one set of the data $DX_{p,q}$. For the condition (1), the actual data size of the data to be written A exceeds one-half of the bit width W, and is thus written into the first memory, and the data to be written C and the data to be written D are written into the second memory 228. For the condition (2), the data to be written A and the data to be written C are written into the first memory 226, and the data to be written D is written into the second memory 228. For either the condition (1) or the condition (2), given that the second memory 228 is implemented by a DRAM or SDRAM having bit width that is smaller than the bit width of the first memory 226, or even implemented by an SRAM, the effect of saving memory space is achieved. Further, in continuation of the scenario (1), whether determination is performed based on the condition (1) or the condition (2), the control circuit 224 writes the data to be written that includes only one set of data $DX_{p,q}$ into the second memory 228 (an SRAM for example). At this point, the space (in bits) used by the first memory 226 is:

$$\left\{ \sum_{i=0}^{95} 16 \times (95 - ((i \times 5) \bmod 96)) \right\} \times 128 \times \left\lceil \frac{12}{6} \right\rceil = 18{,}677{,}760$$

And the space (in bits) used by the second memory space 228 is:

$$\left\{ \sum_{i=0}^{95} 16 \times (95 - ((i \times 5) \bmod 96)) \right\} \times 21 \times 1 = 1{,}532{,}160$$

Thus, it is equivalently exchanging a space having 1,532,160 bits in the second memory 228 for a space having 9,338,880 ($=28{,}016{,}640-18{,}677{,}760$) bits in the first memory 226. Such design effectively enhances the memory utilization efficiency.

More specifically, in the embodiment in the scenario 2, $D0_{p,q}$, $D1_{p,q}$, $D2_{p,q}$ and $D3_{p,q}$ may be used as one group of data to be written $T0_{p,q}$, $D4_{p,q}$, $D5_{p,q}$, $D6_{p,q}$ and $D7_{p,q}$ may be used as one group of data to be written $T1_{p,q}$, $D8_{p,q}$ and $D9_{p,q}$ may be used as one group of data to be written $T2_{p,q}$, and $D12_{p,q}$ may be used as one group of data to be written $T3_{p,q}$. The data $DX_{p,q}$ may be obtained through the buffer circuit 222, and is the $(x*108+p)^{th}$ set of data at the $p^{th}$ time point in the buffer circuit 222. Similarly, the control circuit 224 reads the data $DX_{p,q}$ from the storage circuit 225 according to the time points respectively corresponding to the respective delay lengths Di of the sets of the $DX_{p,q}$. The data of $D0\sim3_{p,q}$ is delayed by $16 \times (95-(p \times 5) \bmod 96)$ time units in the storage circuit 225 and outputted; that is, $T0_{0,q}$ undergoes $16 \times (95-(0 \times 5) \bmod 96)=1520$ time units in the storage circuit 225 and is then outputted. The data of $D4\sim11_{p,q}$ is delayed by $8 \times (95-(p \times 5) \bmod 96)$ time units in the storage circuit 225 and outputted; that is, $T1_{0,q}$ and $T2_{0,q}$ undergo 8×(95−(0×5))mod 96)=760 time units in the storage circuit 225 and are then outputted. The data of $D12_{p,q}$ is delayed by 4×(95(p×5))mod 96) time units in the storage circuit 225 and outputted; that is, $T3_{0,q}$ undergoes 4×(95−(p×5))mod 96)=380 time units in the storage circuit 225 and is then outputted. After reading the data $DX_{p,q}$ from the storage circuit 225, the control circuit 224 stores the data $DX_{p,q}$ in the buffer circuit 223. Next, through adjusting the sequence of outputting the data data $DX_{p,q}$ from the buffer circuit 223, the control circuit 224 outputs the data $DX_{p,q}$ to complete the time de-interleaving process.

In an example below, spaces that the first memory 226 and the second memory 228 may occupy for different bit widths of the first memory 226 are listed (taking the scenario 1 for instance):

Bit Width W=64 Bits

| Ratio of numbers of sets of data $DX_{p,q}$ in first memory 226 and second memory 228 | Space (in bits) used by first memory 226 | Space (in bits) used by second memory 228 |
|---|---|---|
| 13:0 | 23,347,200 | 0 |
| 12:1 | 18,677,760 | 1,532,160 |
| 9:4 | 14,008,320 | 6,128,640 |
| 6:7 | 9,338,880 | 10,725,120 |
| 3:10 | 4,669,440 | 15,321,600 |
| 0:13 | 0 | 19,918,080 |

Bit Width W=128 Bits

| Ratio of numbers of sets of data $DX_{p,q}$ in first memory 226 and second memory 228 | Space (in bits) used by first memory 226 | Space (in bits) used by second memory 228 |
|---|---|---|
| 13:0 | 28,016,640 | 0 |
| 12:1 | 18,677,760 | 1,532,160 |
| 6:7 | 9,338,880 | 10,725,120 |
| 0:13 | 0 | 19,918,080 |

Bit Width W=256 Bits

| Ratio of numbers of sets of data $DX_{p,q}$ in first memory 226 and second memory 228 | Space (in bits) used by first memory 226 | Space (in bits) used by second memory 228 |
|---|---|---|
| 13:0 | 37,355,520 | 0 |
| 12:1 | 18,677,760 | 1,532,160 |
| 0:13 | 0 | 19,918,080 |

One person skilled in the art may understand implementation details and variations of the present invention with reference to the disclosure of the device in FIG. 2 and the disclosure of the method in FIG. 3 and FIG. 4. While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A time de-interleaving method, performing a time de-interleaving process through writing and reading a plurality of sets of time interleaved data into and from a storage circuit, the method comprising:

selecting a K sets from the sets of time interleaved data, the K sets of time de-interleaved data having a same delay length, K being an integer greater than 1;

generating data to be written, the data to be written comprising the K sets of time interleaved data; and in a same writing operation, writing the data to be written into the storage circuit;

wherein, a bit width of the storage circuit is greater than or equal to a data size of the data to be written.

2. The time de-interleaving method according to claim 1, wherein the K sets of data are respectively selected from K groups of time interleaved data groups, and the K groups of time interleaved data correspond to a same time interleaving length.

3. The time de-interleaving method according to claim 1, further comprising:

determining a value of K according to a data size of one set of time interleaved data and the bit width of the storage circuit.

4. The time de-interleaving method according to claim 3, wherein the value of K is smaller than a maximum integer of a quotient obtained by dividing the bit width by the data size of the one set of time interleaved data.

5. The time de-interleaving method according to claim 1, wherein the storage circuit comprises a first memory and a second memory, the first memory uses the bit width as an access unit and stores the data to be written, and the second memory has an access unit smaller than the bit width; the method further comprising:

selecting a set of target time interleaved data, the set of target time interleaved data and the K sets of time interleaved data having the same delay length; and writing the set of target time interleaved data into the second memory.

6. A time de-interleaving circuit, comprising:

a buffer circuit, buffering a plurality of sets of time interleave data;

a storage circuit; and a control circuit, coupled to the buffer circuit and the storage circuit, selecting K sets of the time interleaved data from the storage circuit to form data to be written, and writing the data to be written into the storage circuit in a same writing operation;

wherein, the K sets of time interleaved data have a same delay length, K is an integer greater than 1, and a bit width of the storage circuit is greater than or equal to a data size of the data to be written.

7. The time de-interleaving circuit according to claim 6, wherein the K sets of time interleaved data are selected from K groups of time interleaved data groups, respectively, and the K groups of time interleaved data correspond to a same time interleaving length.

8. The time de-interleaving circuit according to claim 6, wherein the control circuit further determines a value of K according to a data size of one set of time-interleaved data and the bit width of the storage circuit.

9. The time de-interleaving circuit according to claim 8, wherein K is a maximum integer of a quotient obtained by dividing the bit width by the data size of one set of the time interleaved data.

10. The time de-interleaving circuit according to claim 6, wherein the storage circuit comprises:

a first memory, utilizing the bit width as an access unit, storing the data to be written; and a second memory, having an access unit smaller than the bit width;

wherein, the control circuit further selects a set of target time de-interleaved data from the buffer circuit and writes the set of target time interleaved data into the second memory, and the set of target time interleaved data and the K sets of time interleaved data have the same delay length.

11. A time de-interleaving method, performing a time de-interleaving process through writing and reading a plurality of sets of time interleaved data into and from a first memory and a second memory, the method comprising:
selecting a set of first time interleaved data and a set of second time interleaved data from the sets of time interleaved data, the set of first time interleaved data and the set of second time interleaved data having a same delay length;
writing the set of first time interleaved data into the first memory; and
writing the set of second time interleaved data into the second memory;
wherein, the first memory utilizes a bit width as an access unit, and the second memory has an access unit smaller than the bit width.

12. The time de-interleaving method according to claim 11, wherein the set of first time interleaved data and the set of second time interleaved data are simultaneously generated.

13. The time de-interleaving method according to claim 11, further comprising:
selecting (K-1) sets from the plurality of sets of time interleaved data, the (K-1) sets of time interleaved data and the set of first time interleaved data having the same delay length, K being an integer greater than 1;
wherein, the set of first time interleaved data and the (K-1) sets of time interleaved data are simultaneously written into the first memory, and a total data size of the set of first time interleaved data and the (K-1) sets of time interleaved data is smaller than the bit width.

14. The time de-interleaving method according to claim 13, wherein the set of first time interleaved data and the (K-1) sets of time interleaved data are selected from K groups of time interleaved data groups, respectively, and the K groups of time interleaved data groups correspond to a same time interleaving length.

15. The time de-interleaving method according to claim 13, further comprising:

determining a value of K according to a data size of one set of the time interleaved data and the bit width, the value of K being maximum integer of a quotient obtained by dividing the bit width by the data size of the time interleaved data.

16. A time de-interleaving circuit, comprising:
a buffer circuit, buffering a plurality of sets of time interleaved data;
a first memory, utilizing a bit width as an access unit;
a second memory, having an access unit smaller than the bit width; and
a control circuit, coupled to the buffer circuit, the first memory and the second memory, selecting a set of first time interleaved data and a set of second time interleaved data from the buffer circuit, and writing the set of first time interleaved data into the first memory and writing the set of second time interleaved data into the second memory;
wherein, the first memory utilizes a bit width as an access unit, and the second memory has an access unit smaller than the bit width.

17. The time de-interleaving circuit according to claim 16, wherein the set of first time interleaved data and the set of second time interleaved data are simultaneously generated.

18. The time de-interleaving circuit according to claim 16, wherein the control circuit further selects (K-1) sets of time interleaved data from the buffer circuit, and simultaneously writes the set of first time interleaved data and the (K-1) sets of time interleaved data into the first memory, the (K-1) sets of time interleaved data and the set of first time interleaved data have the same delay length, and a total data size of the set of first time interleaved data and the (K-1) sets of time interleaved data is smaller than the bit width.

19. The time de-interleaving circuit according to claim 18, wherein the set of first time interleaved data and the (K-1) sets of time interleaved data are selected from K groups of time interleaved data groups, respectively, and the K groups of time interleaved data groups correspond to a same time interleaving length.

20. The time de-interleaving circuit according to claim 18, wherein the control circuit further determines a value of K according to a data size of one set of the time interleaved data and the bit width, and the value of K is maximum integer of a quotient obtained by dividing the bit width by the data size of one set of the time interleaved data.

* * * * *